US010437321B2

(12) United States Patent
Rowley (10) Patent No.: US 10,437,321 B2
(45) Date of Patent: Oct. 8, 2019

(54) LOW POWER STATE IMPLEMENTATION IN A POWER MANAGEMENT INTEGRATED CIRCUIT

(71) Applicant: Micron Technology, Inc., Boise, ID (US)

(72) Inventor: Matthew David Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/919,053

(22) Filed: Mar. 12, 2018

(65) Prior Publication Data
US 2019/0278363 A1 Sep. 12, 2019

(51) Int. Cl.
*G06F 1/3296* (2019.01)
*G06F 12/02* (2006.01)
*G11C 16/26* (2006.01)
*H01L 27/11526* (2017.01)
*G11C 7/20* (2006.01)
*G11C 7/22* (2006.01)
*H01L 27/11521* (2017.01)
*G11C 16/30* (2006.01)
*G06F 1/3234* (2019.01)

(52) U.S. Cl.
CPC ........ *G06F 1/3296* (2013.01); *G06F 12/0238* (2013.01); *G11C 7/20* (2013.01); *G11C 7/22* (2013.01); *G11C 16/26* (2013.01); *G11C 16/30* (2013.01); *H01L 27/11521* (2013.01); *H01L 27/11526* (2013.01); *G06F 1/3275* (2013.01)

(58) Field of Classification Search
CPC ...... G06F 1/3296; G06F 1/00; G06F 12/0238; G11C 16/30; G11C 16/26; G11C 7/22; G11C 7/20; G11C 5/14; G11C 11/1697; G11C 11/2297; G11C 11/4074; G11C 11/413; G11C 13/0038; G11C 29/08; G11C 29/83; G11C 2207/2227; G11C 2211/4067; H01L 27/11521; H01L 27/11526
See application file for complete search history.

(56) References Cited

U.S. PATENT DOCUMENTS

2017/0153680 A1* 6/2017 Girard ................... G06F 1/266
2017/0284731 A1* 10/2017 Smith ...................... F24C 7/10
2018/0088658 A1* 3/2018 McFarlane ............ G06F 1/3275

* cited by examiner

Primary Examiner — Harry W Byrne
Assistant Examiner — Sultana Begum
(74) Attorney, Agent, or Firm — Greenberg Traurig, LLP (57) ABSTRACT

A power management integrated circuit (PMIC) that has multiple sets of circuits to provide certain same power management functionalities in different power modes, such as voltage, current and temperature sensing and/or measuring, generating of reference states or biases to effectuate circuit protection in various conditions, such as under voltages, over voltages, etc. One set of circuits is configured to operate during a normal mode and is optimized for performance, speed and/or accuracy. Another set of circuits is configured to operate during a sleep mode and is optimized for reduced power consumption where the performance, speed and/or accuracy may be inferior to the circuits for the normal mode but the functionality is maintained within the low power consumption constraint.

20 Claims, 3 Drawing Sheets

LOW POWER STATE IMPLEMENTATION IN A POWER MANAGEMENT INTEGRATED CIRCUIT

FIELD OF THE TECHNOLOGY

At least some embodiments disclosed herein relate to power management integrated circuit (PMIC) in general and, more particularly but not limited to, low power state implementation in a PMIC.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

A memory system may use a Power Management Integrated Circuit (PMIC) to manage the power requirements of the system or subsystem. The PMIC typically includes electronic power conversion circuitry and/or relevant power control functions.

A memory system may have one or more power modes at reduced power consumption levels, such as a sleep mode and a power shutdown mode. When in the sleep mode, power to some components of the memory system may be turned off. When in the power shutdown mode, most of the memory system is turned off, except a minimal circuitry that is used to detect a signal or indication that requires the memory system to wake up or power up.

BRIEF DESCRIPTION OF THE DRAWINGS

The embodiments are illustrated by way of example and not limitation in the figures of the accompanying drawings in which like references indicate similar elements.

DETAILED DESCRIPTION

Aspects of the present disclosure are directed to a power management integrated circuit (PMIC) in a memory system. An example of a memory system is a storage system, such as a solid-state drive (SSD). In some embodiments, the memory system is a hybrid memory/storage system. In general, a host system can utilize a memory system that includes one or more memory devices. The memory devices can include media. The media can be non-volatile memory devices, such as, for example, negative-and (NAND). The host system can provide write requests to store data at the memory devices of the memory system and can provide read requests to retrieve data stored at the memory system. A memory system can include a controller that manages the memory devices to perform operations such as reading data, writing data, or erasing data and other such operations. A storage system (also hereinafter referred to as storage device) is used as one example of the memory system hereinafter throughout this document.

The PMIC of at least some embodiments disclosed herein provides normal power circuits and alternate low power circuits. During entry to low power states or modes, the power management integrated circuit (PMIC) shifts from using the normal power circuits to using the alternate low power circuits in providing certain functions related to power managements, instead of simply shutting down or turning of the corresponding functions. The use of the alternate low power circuits reduces the quiescent power consumption to meet the low power consumption requirements of the low power states or modes. The alternate low power circuits offer operational functions at a reduced performance level, which is an improvement over the lack of the functions as a result of shutting down the respective circuits designed for normal operations in order to meet the power consumption requirements of the low power states or modes.

For example, Peripheral Component Interconnect Express (PCIe) and Serial Advanced Technology Attachment (SATA) standards specify extremely low power consumption targets for low power states/modes. Instead of shutting down certain functions of a power management integrated circuit (PMIC) in the low power states/modes to reduce the power consumption and meet the power consumption targets, an alternative set of circuits is used to provide the functions at a reduced power consumption level, with a reduced service frequency, accuracy, and/or performance level in comparison with the normal mode of operations, such that the functions are not completely eliminated during the low power states/modes.

For example, a power management integrated circuit (PMIC) of one embodiment disclosed herein has a dual circuit design, where one set of circuits is optimized for use during normal operations and another set of circuits is optimized for operations during a sleep mode under a low power consumption constraint. The dual circuit design allows the power management integrated circuit (PMIC) to maintain functionalities, such as over and under voltage monitoring, over current monitoring, temperature sensing, protecting circuits, etc., during the sleep mode. Such functionalities are in operation to improve the operational quality of the storage device while meeting the power consumption target of the sleep mode.

Figure 1:
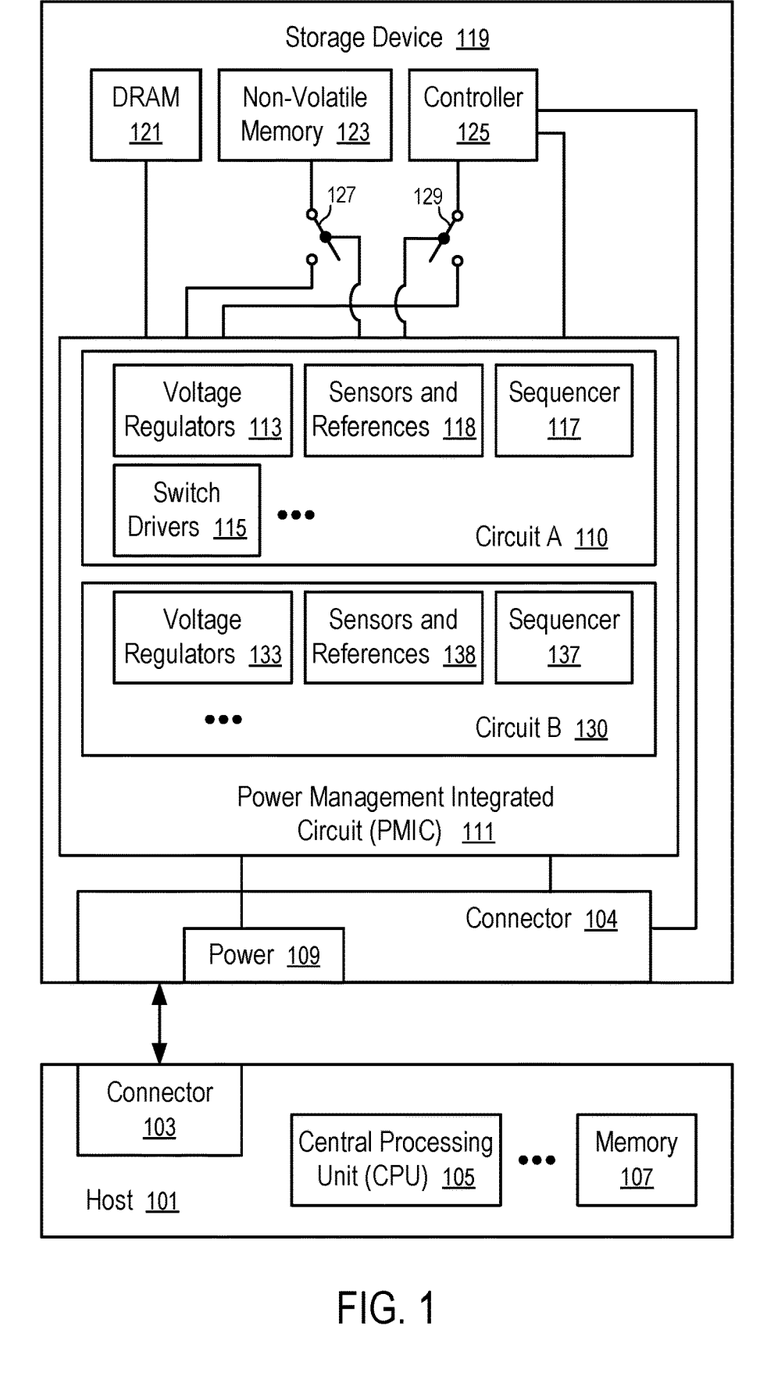
FIG. 1 shows a computer system having a power management integrated circuit (PMIC) that uses different circuits configured for different power modes.

FIG. 1 shows a computer system having a power management integrated circuit (PMIC) that uses different circuits configured for different power modes.

The computer system of FIG. 1 includes a host (101) connected to a storage device (119) that has a power management integrated circuit (PMIC) (111), a controller (125), a non-volatile memory (123), and an optional Dynamic Random-Access Memory (DRAM) (121).

The PMIC (111) has two sets of circuits (110 and 130) optimized for different modes of operations of the storage device (119). When the storage device (119) is in active operations (e.g., retrieving data from the non-volatile memory (123), writing/programming data into the non-volatile memory (123)), the PMIC (111) uses the circuit A (110). When the storage device (119) is instructed to sleep or shut down, the PMIC (111) uses the circuit B (130) that provides a level of power management services within the constraint of a low power consumption target.

The PMIC (111) optimizes and/or minimizes power consumption in a sleep mode of operations while maintaining operational capability in power management. This is achieved by elegant transfer of the performance of certain functions from the normal operational mode circuit A (110) to the low power mode circuit B (130). The lower power mode circuit B (130) implements a trade-off in response time and error for reduced power consumption, but maintains the functionality.

For example, sensors and references (118) used by the PMIC (111) during normal operations have faster response time and better accuracy than sensors and references (138) used by the PMIC (111) in the sleep mode. However, the sensors and references (138) used by the PMIC (111) in the sleep mode have a lower power consumption level than the sensors and references (118) used by the PMIC (111) during normal operations. Thus, the PMIC (111) reduces power consumption related to the functionalities of the sensors and references (118/138) while maintaining a level of operational quality higher than simply turning off the sensors and references.

Examples of operational circuits of (PMIC) that are shifted during changes of power modes include biases, over voltage and under voltage comparators for various power rails (including the system power rail of the PMIC (111) and applicable power rails supplied by the PMIC (111) to power other components of the storage device (119)), over current monitors, regulator error comparators, oscillators, charge pumps of switch drivers, temperature sensor circuits, inrush monitors, etc.

In general, the host (101) can be a computer having one or more Central Processing Units (CPUs) (105) and a memory (107). Computer peripheral devices, such as the storage device (119), may be attached to the host (101) via an interconnect, such as a computer bus (e.g., Peripheral Component Interconnect (PCI), PCI eXtended (PCI-X), PCI Express (PCIe), Serial Advanced Technology Attachment (SATA)), a communication port, and/or a computer network.

The host (101) has one or more connectors (e.g., 103) to provide the storage device (119) with power (109) and/or to communicate with the storage device (119) via a communication channel in accordance with a predetermined protocol; and the storage device (119) has one or more connectors (e.g., 104) to receive the power (109), data and commands from the host (101).

The PMIC (111) has one or more voltage regulators (113 and 133) that convert the power (109) to operating voltages used by various components of the storage device (119), such as the controller (125), the non-volatile memory (123), and the DRAM (121).

The storage device (119) may include a plurality of load switches (e.g., 127 and 129) for the isolation of power domains. During certain operational modes the load switches (127 and 129) are turned on to provide power (109) via the voltage regulators (113) to these corresponding components. During certain non-operational modes the load switches (127 and 129) can be turned off to isolate the power (109) from some of the components of the storage device (119), such as the controller (125), the non-volatile memory (123). To reduce the cost of the PMIC (111), the load switches (127 and 129) are implemented outside of the PMIC (111). The PMIC (115) includes a plurality of switch drivers (115) that provide the control signals for the load switches (127 and 129).

The PMIC (111) includes a sequencer (117 or 137) that schedules the power related events according to desirable sequences for the operations of the storage device (119), including the sequences of the operations of the voltage regulators (113) and the switch drivers (115). In some situations the sequencer (117 or 137) may communicate with the controller (125) to request the controller (125) to enter a sleep mode or a power off mode and then turn off certain voltages or power domains; and in other situations, the controller (125) may request the sequencer (117) to place the PMIC (111) in a sleep mode.

In one example, a storage device (119) is configured on a Serial Advanced Technology Attachment (SATA) bus and has a sleep mode and a power shutdown mode. When in the sleep mode, power supply to some components of the SATA storage device (119), such as the controller (125) may be turned off completely. When in the power shutdown mode, the SATA storage device (119) is shut off almost completely, except that a minimal amount of circuitry (e.g., circuit B (130) or a portion of it) is kept alive or powered on to wake the SATA storage device (119) in response to an enable signal on the SATA bus.

In another example, a storage device (119) is configured on a Peripheral Component Interconnect Express (PCIe) bus and may also have a sleep mode and a power shutdown mode. When in the sleep mode, the power supply to some components of the PCIe storage device, such as most of the controller may be turned off, except that a small portion of the controller (125) is kept alive or powered on to monitor the bus for an indication to exit the sleep mode. When in the power shutdown mode, the PCIe storage device (119) is shut off almost completely, including the controller (125), except that a minimal amount of circuitry (e.g., circuit B (130) or a portion of it) is kept alive or powered on to wake the PCIe storage device (119) in response to a wake signal.

In some instances, the same PMIC (111) is configured to be capable of being used in the SATA storage device (119) and in the PCIe storage device (119). The PMIC (111) is capable of accommodating the different power management requirements of SATA storage devices and PCIe storage devices.

In general, some control signals, data and/or commands received from the host (101) are connected to the PMIC (111) for power managements. Other control signals, data and commands from the host (101) are routed to the controller (125) for processing.

The computer storage device (119) can be used to store data for the host (101). Examples of computer storage devices in general include hard disk drives (HDDs), solid state drives (SSDs), flash memory, dynamic random-access memory, magnetic tapes, network attached storage device, etc. The storage device (119) communications with the host (101) using the communication channel. For example, the communication channel between the host (101) and the storage device (119) is a PCIe bus in one embodiment; and the host (101) and the storage device (119) communicate with each other using NVMe protocol.

In some implementations, the communication channel between the host (101) and the storage device (119) includes a computer network, such as a local area network, a wireless local area network, a wireless personal area network, a cellular communications network, a broadband high-speed always-connected wireless communication connection (e.g., a current or future generation of mobile network link); and the host (101) and the storage device (119) can be configured to communicate with each other using data storage management and usage commands similar to those in NVMe protocol.

The controller (125) of the storage device (119) runs firmware to perform operations responsive to the communications from the host (101) and/or the PMIC (111). Firmware in general is a type of computer program that provides control, monitoring and data manipulation of engineered computing devices. The firmware of the storage device (119)

controls the operations of the controller (125) in operating the storage device (119), such as storing and accessing data in non-volatile memory (123) of the storage device (119), performing power management tasks, etc.

Non-volatile storage media (123) in general may be implemented via various techniques, such as memory cells in an integrated circuit, magnetic material coated on rigid disks, etc. The storage media (123) is non-volatile in that no power is required to maintain the data/information stored in the non-volatile storage media (123), which data/information can be retrieved after the non-volatile storage media (123) is powered off and then powered on again. The memory cells may be implemented using various memory/ storage technologies, such as NAND gate based flash memory, phase-change memory (PCM), magnetic memory (MRAM), resistive random-access memory, and 3D XPoint, such that the storage media (123) is non-volatile and can retain data stored therein without power for days, months, and/or years.

The storage device (119) may use volatile Dynamic Random-Access Memory (DRAM) (121) for the storage of run-time data and instructions used by the controller (125) to improve the computation performance of the controller (125) and/or provide buffers for data transferred between the host (101) and the non-volatile storage media (123). DRAM (121) is volatile in that it requires power to maintain the data/information stored therein, which data/information is lost immediately or rapidly when the power is interrupted.

Volatile DRAM (121) typically has less latency than non-volatile storage media (123), but loses its data quickly when power is removed. Thus, it is advantageous to use the volatile DRAM (121) to temporarily store instructions and data used for the controller (125) in its current computing task to improve performance. In some instances, the volatile DRAM (121) is replaced with volatile Static Random-Access Memory (SRAM) that uses less power than DRAM in some applications. When the non-volatile storage media (123) has data access performance (e.g., in latency, read/ write speed) comparable to volatile DRAM (121), the volatile DRAM (121) can be eliminated; and the controller (125) can perform computing by operating on the non-volatile storage media (123) for instructions and data instead of operating on the volatile DRAM (121).

For example, cross point storage and memory devices (e.g., 3D XPoint memory) have data access performance comparable to volatile DRAM (121). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

In some instances, the controller (125) has in-processor cache memory with data access performance that is better than the volatile DRAM (121) and/or the non-volatile storage media (123). Thus, it is preferred to cache parts of instructions and data used in the current computing task in the in-processor cache memory of the controller (125) during the computing operations of the controller (125). In some instances, the controller (125) has multiple processors, each having its own in-processor cache memory.

Optionally, the controller (125) performs data intensive, in-memory processing using data and/or instructions organized in the storage device (119). For example, in response to a request from the host (101), the controller (125) performs a real time analysis of a set of data stored in the storage device (119) and communicates a reduced data set to the host (101) as a response. For example, in some applications, the storage device (119) is connected to real time sensors to store sensor inputs; and the processors of the controller (125) are configured to perform machine learning and/or pattern recognition based on the sensor inputs to support an artificial intelligence (AI) system that is implemented at least in part via the storage device (119) and/or the host (101).

In some implementations, the processors of the controller (125) are integrated with memory (e.g., 121 or 123) in computer chip fabrication to enable processing in memory and thus overcome the von Neumann bottleneck that limits computing performance as a result of a limit in throughput caused by latency in data moves between a processor and memory configured separately according to the von Neumann architecture. The integration of processing and memory increases processing speed and memory transfer rate, and decreases latency and power usage.

The storage device (119) can be used in various computing systems, such as a cloud computing system, an edge computing system, a fog computing system, and/or a standalone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage. A fog computing system uses one or more end-user devices or near-user edge devices to store data and thus reduces or eliminates the need to store the data in a centralized data warehouse.

Some embodiments involving the operation of the controller (125) can be implemented using computer instructions executed by the controller (125), such as the firmware of the controller (125). In some instances, hardware circuits can be used to implement at least some of the functions of the firmware. The firmware can be initially stored in the non-volatile storage media (123), or another non-volatile device, and loaded into the volatile DRAM (121) and/or the in-processor cache memory for execution by the controller (125).

Figure 2:
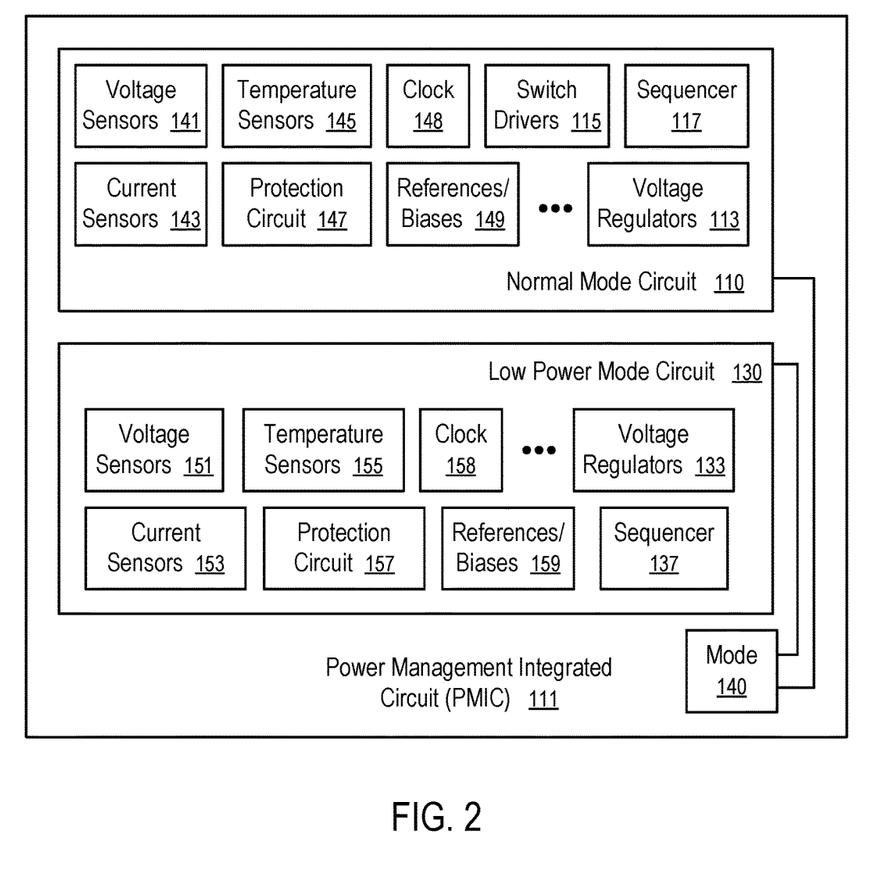
FIG. 2 shows a power management integrated circuit (PMIC) having different circuits optimized for operations in different power modes.

FIG. 2 shows a power management integrated circuit (PMIC) (111) having different circuits (110 and 137) optimized for operations in different power modes. For example, the PMIC (111) of FIG. 2 can be used in the computer system of FIG. 1 that has a normal mode and a low power mode.

The PMIC (111) of FIG. 2 has two versions of circuits for a typical functionality that are maintained in the low power mode for improved performance, instead of being turned off. Examples of such functionalities include sensing/measuring of voltages, currents, and/or temperatures, circuit protection, clock, reference states, biases, error detection, voltage regulation, switch driving, event scheduling/sequencing, etc.

The operation mode (140) of the PMIC (111) controls which version of the circuits is used in the current mode of operations; and the other version that is not currently being used is turned off.

The normal mode circuit (110) is used during normal/ active operations of the storage device (119) in which the PMIC (111) is configured. During the normal/active operations, the storage device (119) receives read and/or write requests for corresponding operations on the non-volatile memory (123).

The low power mode circuit (130) is used during an inactive state of the storage device (119) where the PMIC (111) may reduce and/or turn off the power provided to some of the components of the storage device (119), such as the non-volatile memory (123), the controller (125), and/or the DRAM (121).

A typical portion of the low power mode circuit (130) provides the same or similar function as a corresponding portion of the normal mode circuit (110) at a reduced power consumption level, with trade-offs in speed, accuracy, frequency, etc.

For example, the voltage sensors (151) of the low power mode circuit (130) are used to measure the voltages at the same circuit locations as the voltage sensors (141) of the normal mode circuit (110) such that the voltages at the circuit locations can be monitored by the PMIC (111) even in the low power mode. The voltage sensors (151) perform the measurements at a lower frequency and/or a lower precision level with lower power consumption than the voltage sensors (141) of the normal mode circuit (110).

In some instances, voltage measurements performed at some circuit locations in the normal mode circuit (110) may be shut down without a corresponding voltage sensor operating at the same locations in the low power mode (e.g., when the power at the circuit locations are turned off during the low power mode).

In some instances, voltage measurements performed at some circuit locations using multiple voltage sensors (141) in the normal mode circuit (110) are replaced with voltage measurements performed at the same circuit locations using fewer voltage sensors (151) in the lower power mode circuit (110). For example, a voltage sensor (151) may be dynamically coupled to different locations to perform measurements at different time instances to generate measurements at a lower frequency.

Similarly, the current sensors (153) of the low power mode circuit (130) are used to measure the electric currents at the same circuit locations as the current sensors (143) of the normal mode circuit (110) such that the currents at the circuit locations can be monitored by the PMIC (111) even in the low power mode. The current sensors (153) perform the measurements at a lower frequency and/or a lower precision level with lower power consumption than the current sensors (143) of the normal mode circuit (110).

In some instances, current measurements performed at some circuit locations in the normal mode circuit (110) may be shut down without a corresponding current sensor operating at the same locations in the low power mode.

In some instances, current measurements performed at some circuit locations using multiple current sensors (143) in the normal mode circuit (110) are replaced with current measurements performed at the same circuit locations using fewer current sensors (153) in the lower power mode circuit (110). For example, a current sensor (153) may be dynamically coupled to different locations to perform measurements at different time instances to generate measurements at a lower frequency.

Similarly, the temperature sensors (155) of the low power mode circuit (130) are used to measure the temperatures at the same locations in the PMIC (111) as the temperature sensors (145) of the normal mode circuit (110) such that the temperatures at the locations can be monitored by the PMIC (111) even in the low power mode. The temperature sensors (155) perform the measurements at a lower frequency and/or a lower precision level with lower power consumption than the temperature sensors (145) of the normal mode circuit (110).

For example, the clock (158) of the low power mode circuit (130) is configured to use a circuit implementation that uses less power than the clock (148) of the normal mode circuit (148). The clock (158) of the low power mode circuit (130) can be configured to run at a lower frequency than the clock (148) of the normal mode circuit (148) to reduce the power consumption of the PMIC (111) during the low power mode.

For example, the protection circuit (157), the references/bias (159), and the voltage regulators (133) of the low power mode circuit (130) can be low power alternative implementations that provide the same services/functionalities as the respective protection circuit (147), the references/bias (149), and the voltage regulators (113) of the normal mode circuit (110).

The sequencer (137) of the low power mode circuit (130) may implement a set of power event sequences (e.g., for transition to the normal mode) that is different from a set of power event sequences implemented by the sequencer (117) of the normal mode circuit (110) (e.g., for transition to the low power mode).

In general, it is not necessary to provide a low power mode version of circuitry to implement each function found in the normal mode circuit (110). Some of the functionalities may be adjusted to a low power mode via the use of a different operating parameter, such as a reduced clock. Some of the functionalities may be turned off. Some of the functionalities may remain the same in both the normal mode and the sleep mode.

When the PMIC (111) enters the low power mode, the tasks of performing the functions of the sensors (141, 143, 145), the protection circuit (147), the clock (148), the references and biases (149), the voltage regulators (113) and the sequencer (117) of the normal mode circuit (110) are transferred to the respective sensors (151, 153, 155), the protection circuit (157), the clock (158), the references and biases (159), the voltage regulators (133) and the sequencer (137) of the low power mode circuit (130). When the PMIC (111) enters the normal mode, the tasks are transferred from the low power mode circuit (130) back to the normal mode circuit (110).

Figure 3:
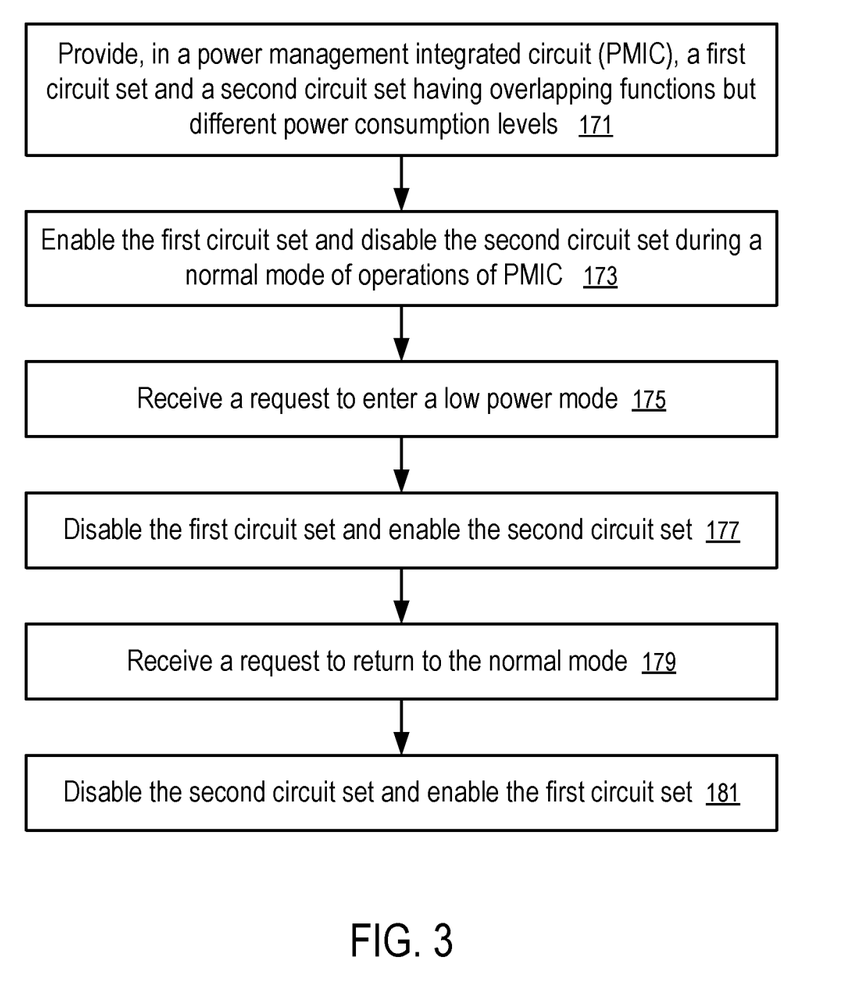
FIG. 3 shows a method to implement different power modes in a power management integrated circuit (PMIC).

FIG. 3 shows a method to implement different power modes in a power management integrated circuit (PMIC). For example, the method of FIG. 3 can be implemented in a PMIC (111) of FIGS. 1 and 2.

The method of FIG. 3 includes: providing (171), in a power management integrated circuit (PMIC) (111), a first circuit set (110) and a second circuit set (140) having overlapping functions but different power consumption levels; enabling (173) the first circuit set (110) and disabling (173) the second circuit set during a normal mode of operations of PMIC (111); receiving (175) a request to enter a low power mode; disabling (177) the first circuit set (110) and enabling (177) the second circuit set (130) that provides certain functionalities of the first circuit set (110) that is being disabled; receiving (179) a request to return to the normal mode; and disabling (181) the second circuit set (130) and enabling (181) the first circuit set (110) to replace the functionalities provided by the second circuit set (130).

For example, a power management integrated circuit (PMIC) (111) includes a first set of circuits (110) providing first functionalities in managing power and second functionalities in managing power. The PMIC (111) further include a second set of circuits (130) having the same first functionalities in managing power. The operations of the second set of circuits (130) in providing the first functionalities consume less power than operations of the first set of circuits (110) in providing the first functionalities. When operated in a normal mode, the PMIC (111) disables the second set of circuits (130) and enables the first set of circuits (110) to provide the first and second functionalities in managing power. When operated in a low power mode (e.g., a sleep mode), the PMIC (111) disables the first set of circuits (110) and enables the second set of circuits (130) to provide the first functionalities in managing power. The second set of circuits (130) does not provide the second functionalities that are not needed in the lower power mode.

For example, in response to being operated in the first mode, the PMIC (111) shuts down the second set of circuits (130) and operates the first set of circuits (110) to provide the first functionalities in managing power. In response to being operated in the second mode, the PMIC (111) shuts down the first set of circuits (110) and operates the second set of circuits (130) to provide the first functionalities in managing power.

For example, the first functionalities may include generating measurements of power operation states (e.g., voltage, current, temperature) in the power management integrated circuit, generating references of states in the power management integrated circuit, and comparing the measurements and the references to effectuate circuit protection (e.g., in response to conditions such as over voltage, under voltage, over current, etc.

For example, the first functionalities may include error detection in voltage regular, oscillator operations to generate clock signals, charge pump operations to keep load switches on, sensing temperature to prevent over heat, inrush monitoring, etc.

To provide a same functionality, a circuit in the first set (110) is optimized for performance, speed, and/or accuracy and/or operated at a higher frequency, while a corresponding circuit in the second set (130) is optimized under a low power consumption budget for limited performance, speed, and/or accuracy and/or operated at a lower frequency.

For example, when the PMIC (111) is configured in a storage device (119) having a non-volatile memory (123) and a controller (125) that receive powers from the PMIC (111) and/or rely upon the PMIC (111) to manage their power usages, the PMIC uses the first set of circuits (110) during a normal mode of operation where the controller (125) operates on the non-volatile memory (123) for read and write options. When the storage device (119) is instructed to enter a sleep mode where the storage device is not sufficiently powered to operate on the non-volatile memory (123) for read and write operations, the PMIC (111) shuts down the first set of circuits (110) and operates the second set of circuits (130) to maintain the first functionalities at a lower power consumption level with trade-offs in performance, speed, accuracy, and/or service frequency. When the storage device (119) is back to the normal mode to perform read and write operations, the second set of circuits (130) is shut down; and the first set of circuits (110) is operated to take over the performance of the first functionalities and other functionalities.

A non-transitory computer storage medium can be used to store instructions of the firmware of the storage device (119). When the instructions are executed by the controller (125) of the computer storage device (119), the instructions cause the controller (125) to perform a method discussed above.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or microcontroller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A power management integrated circuit, comprising:
   a first set of circuits providing at least first functionalities in managing power; and
   a second set of circuits providing the first functionalities in managing power;
   wherein operations of the second set of circuits in providing the first functionalities consume less power than operations of the first set of circuits in providing the first functionalities;
   wherein, when operated in a first mode, the power management integrated circuit disables the second set of circuits and enables the first set of circuits to provide the first functionalities in managing power; and
   wherein, when operated in a second mode, the power management integrated circuit disables the first set of circuits and enables the second set of circuits to provide the first functionalities in managing power.

2. The power management integrated circuit of claim 1, wherein the first set of circuits further provides second functionalities when the power management integrated circuit is operated in the first mode; and the second set of circuits does not provide the second functionalities when the power management integrated circuit is operated in the second mode.

3. The power management integrated circuit of claim 1, wherein the first functionalities comprise generating measurements of power operation states in the power management integrated circuit.

4. The power management integrated circuit of claim 3, wherein the first functionalities comprise generating references of states in the power management integrated circuit.

5. The power management integrated circuit of claim 4, wherein the first functionalities comprise comparing the measurements and the references.

6. The power management integrated circuit of claim 5, wherein the first functionalities comprise effectuating circuit protection responsive to results of comparing the measurements and the references.

7. The power management integrated circuit of claim 6, wherein the first functionalities comprise sensing or measuring:
   voltages;
   electric currents; or
   temperatures.

8. The power management integrated circuit of claim 6, wherein the first functionalities comprise providing clock signals.

9. The power management integrated circuit of claim 6, wherein the first functionalities comprise generating control signals for switches.

10. The power management integrated circuit of claim 1, wherein one of the first functionalities, provided at a first speed by the first set of circuits in the first mode of the power management integrated circuit, is provided at a second speed, lower than the first speed, by the second set of circuits in the second mode of the power management integrated circuit.

11. The power management integrated circuit of claim 1, wherein one of the first functionalities, provided at a first accuracy level by the first set of circuits in the first mode of the power management integrated circuit, is provided at a second accuracy level, lower than the first accuracy level, by the second set of circuits in the second mode of the power management integrated circuit.

12. The power management integrated circuit of claim 1, wherein one of the first functionalities, provided at a first frequency by the first set of circuits in the first mode of the power management integrated circuit, is provided at a second frequency, lower than the first frequency, by the second set of circuits in the second mode of the power management integrated circuit.

13. A method implemented in a power management integrated circuit, the method comprising:
   providing, in the power management integrated circuit, a first set of circuits implementing at least first functionalities in managing power;
   providing, in the power management integrated circuit, a second set of circuits providing the first functionalities in managing power, wherein operations of the second set of circuits in providing the first functionalities consume less power than operations of the first set of circuits in providing the first functionalities;
   in response to being operated in a first mode, shutting down the second set of circuits and operating the first set of circuits to provide the first functionalities in managing power; and
   in response to being operated in a second mode, shutting down the first set of circuits and operating the second set of circuits to provide the first functionalities in managing power.

14. The method of claim 13, further comprising:
   providing second functionalities in the first mode, wherein the second functionalities are not provided in the second mode.

15. The method of claim 14, wherein the first functionalities comprise:
   sensing power states in the power management integrated circuit.

16. The method of claim 15, wherein the first functionalities comprise:
generating reference states; and
comparing the references states with the sensed power states.

17. The method of claim 16, wherein the first functionalities comprise:
effectuating circuit protection in response to results of the comparing the references states with the sensed power states.

18. A system, comprising:
a non-volatile memory device; and
a power management integrated circuit having voltage regulators to generate operating voltages for the non-volatile memory device, the power management integrated circuit including:
a first set of circuits providing at least functionalities managing power; and
a second set of circuits providing the same functionalities in managing power;
wherein, when the system is switched from a normal mode to a sleep mode, the power management integrated circuit transfers the functionalities from being performed using the first set of circuits to being performed using the second set of circuits; and
wherein, when the system is switched from the sleep mode to the normal mode, the power management integrated circuit transfers the functionalities from being performed using the second set of circuits to being performed using the first set of circuits.

19. The system of claim 18, wherein when in the normal mode, a controller coupled to the power management integrated circuit operates on the non-volatile memory device; and when in the sleep mode, the system is not sufficiently powered to operate on the non-volatile memory device.

20. The system of claim 18, wherein the second set of circuits providing the same functionalities at a reduced power consumption level and at a reduced speed, accuracy, or frequency.

* * * * *